(12) United States Patent
Patel et al.

(10) Patent No.: US 8,472,003 B2
(45) Date of Patent: Jun. 25, 2013

(54) FLUID HANDLING STRUCTURE, LITHOGRAPHIC APPARATUS AND DEVICE MANUFACTURING METHOD

(75) Inventors: Hrishikesh Patel, Eindhoven (NL);
Johannes Henricus Wilhelmus Jacobs, Heeze (NL); Paulus Martinus Maria Liebregts, Veldhoven (NL); Ronald Van Der Ham, Maarheeze (NL); Wilhelmus Franciscus Johannes Simons, Beesel (NL); Daniel Jozef Maria Direcks, Simpelveld (NL); Franciscus Johannes Joseph Janssen, Geldrop (NL); Paul Petrus Joannes Berkvens, Veldhoven (NL); Gert-Jan Geradus Johannes Thomas Brands, Waalre (NL); Koen Steffens, Veldhoven (NL); Han Henricus Aldegonda Lempens, Weert (NL); Matheus Anna Karel Van Lierop, Eindhoven (NL); Christophe De Metsenaere, Eindhoven (NL); Marcio Alexandre Cano Miranda, Eindhoven (NL); Patrick Johannes Wilhelmus Spruytenburg, Eindhoven (NL); Joris Johan Anne-Marie Verstraete, Waalre (NL); Ruud Hendrikus Martinus Johannes Bloks, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 354 days.

(21) Appl. No.: 12/820,991

(22) Filed: Jun. 22, 2010

(65) Prior Publication Data
US 2011/0005603 A1    Jan. 13, 2011

Related U.S. Application Data

(60) Provisional application No. 61/213,656, filed on Jun. 30, 2009.

(51) Int. Cl.
*G03B 27/52* (2006.01)
*G03B 27/42* (2006.01)

(52) U.S. Cl.
USPC .................................. 355/30; 355/53

(58) Field of Classification Search
USPC ....................... 355/30, 53; 250/548
See application file for complete search history.

(56) References Cited

U.S. PATENT DOCUMENTS 4,509,852 A    4/1985  Tabarelli et al.
7,304,715 B2 *  12/2007 Cadee et al. ............... 355/30

(Continued)

FOREIGN PATENT DOCUMENTS

EP    1 420 298 A2    5/2004
EP    1 420 300 A2    5/2004

(Continued)

OTHER PUBLICATIONS

Japanese Office Action mailed Jul. 31, 2012 in corresponding Japanese Patent Application No. 2010-142155.

(Continued)

*Primary Examiner* — Hung Henry Nguyen
(74) *Attorney, Agent, or Firm* — Pillsbury Winthrop Shaw Pittman LLP

(57) ABSTRACT

A fluid handling structure configured to supply and confine immersion liquid to a space defined between a projection system and a facing surface facing the fluid handling structure is disclosed. The fluid handling structure includes a supply passage formed therein for the passage of fluid from outside the fluid handling structure to the space, and a thermal isolator positioned adjacent the supply passage at least partly to isolate fluid in the supply passage from a thermal load induced in the fluid handling structure.

24 Claims, 7 Drawing Sheets

U.S. PATENT DOCUMENTS

| | | |
|---|---|---|
| 7,701,551 B2 | 4/2010 | De Graaf |
| 7,738,074 B2 | 6/2010 | Streefkerk et al. |
| 7,804,575 B2 | 9/2010 | Cadee et al. |
| 2004/0136494 A1 | 7/2004 | Lof et al. |
| 2004/0207824 A1 | 10/2004 | Lof et al. |
| 2005/0179877 A1 | 8/2005 | Mulkens et al. |
| 2006/0033892 A1 | 2/2006 | Cadee et al. |
| 2006/0033898 A1 | 2/2006 | Cadee et al. |
| 2006/0038968 A1 | 2/2006 | Kemper et al. |
| 2006/0087630 A1 | 4/2006 | Kemper et al. |
| 2006/0119809 A1 | 6/2006 | Verhagen et al. |
| 2006/0158627 A1 | 7/2006 | Kemper et al. |
| 2007/0243329 A1 | 10/2007 | De Graaf |
| 2007/0252964 A1* | 11/2007 | Kohno et al. ............ 355/53 |
| 2007/0258060 A1 | 11/2007 | Chen et al. |
| 2008/0106707 A1 | 5/2008 | Kobayashi et al. |
| 2008/0212046 A1 | 9/2008 | Riepen et al. |
| 2009/0135385 A1 | 5/2009 | Gellrich et al. |
| 2009/0279060 A1 | 11/2009 | Direcks et al. |
| 2009/0316121 A1 | 12/2009 | Janssen et al. |
| 2010/0060868 A1 | 3/2010 | Tanasa et al. |

FOREIGN PATENT DOCUMENTS

| | | |
|---|---|---|
| JP | 2005-051231 | 2/2005 |
| JP | 2005-252247 | 9/2005 |
| JP | 2005-353820 | 12/2005 |
| JP | 2006-054468 | 2/2006 |
| JP | 2006-156974 | 6/2006 |
| JP | 2007-005362 | 1/2007 |
| JP | 2007-053193 | 3/2007 |
| JP | 2007-184336 | 7/2007 |
| JP | 2007-288185 | 11/2007 |
| WO | 99/49504 A1 | 9/1999 |
| WO | 2005/038888 | 4/2005 |
| WO | 2005/064405 A2 | 7/2005 |
| WO | 2006/101120 | 9/2006 |
| WO | 2007/023813 | 3/2007 |
| WO | 2007/128835 | 11/2007 |

OTHER PUBLICATIONS

Japanese Office Action mailed Mar. 22, 2012 in corresponding Japanese Patent Application No. 2010-142155.

* cited by examiner

– PRIOR ART –

FLUID HANDLING STRUCTURE, LITHOGRAPHIC APPARATUS AND DEVICE MANUFACTURING METHOD

This application claims priority and benefit under 35 U.S.C. §119(e) to U.S. Provisional Patent Application No. 61/213,656, entitled "Fluid Handling Structure, Lithographic Apparatus and Device Manufacturing Method", filed on Jun. 30, 2009. The content of that application is incorporated herein in its entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

PCT patent application publication WO 2005/064405 discloses another type of immersion system arrangement referred to the all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the substrate tables swap may take place under the projection system.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. The fluid handling system is located between the projection system and the substrate table. In reference to the aforementioned description, reference in this paragraph to a feature defined with respect to fluid may be understood to include a feature defined with respect to liquid.

SUMMARY

The refractive index of immersion liquid is sensitive to temperature. Therefore a temperature variation of liquid in the space can result in changes in refractive index and thereby an imaging error. An imaging error may include a focusing error and/or an overlay error. Therefore the temperature of immersion liquid provided to the fluid handling system for provision to the space between the final element of the projection system and the substrate is carefully controlled.

It is desirable, for example, to provide a fluid handling structure in which one or measures are taken to reduce or eliminate immersion liquid provided by the handling structure to the space changing temperature while in the fluid handling structure.

According to an aspect, there is provided a fluid handling structure configured to supply and confine immersion liquid to a space defined between a projection system and a facing surface facing the fluid handling structure, the fluid handling structure comprising: a supply passage formed therein for the passage of fluid from outside the fluid handling structure to the space; and a thermal isolator positioned adjacent the supply passage at least partly to isolate fluid in the supply passage from a thermal load induced in the fluid handling structure.

According to an aspect, there is provided a fluid handling structure configured to supply and confine immersion liquid to a space defined between a projection system and a facing surface facing the fluid handling structure, the fluid handling structure comprising: a supply passage formed therein for the passage of temperature conditioned fluid from outside the fluid handling structure to an opening formed in a surface of the fluid handling structure defining the space or to an opening formed in an under surface of the fluid handling structure; and a further passage formed in the fluid handling structure for the passage therein of temperature conditioned fluid which has not left the fluid handling structure and provided through the supply passage.

According to an aspect, there is provided a fluid handling structure configured to supply and confine immersion liquid to a space defined between a projection system and a facing surface facing the fluid handling structure, the fluid handling structure comprising: a removal passage formed in the fluid handling structure for the passage of fluid from the space through the fluid handling structure to outside of the fluid handling structure, wherein the path of the removal passage meanders through the fluid handling structure so as to thermally condition the fluid handling structure.

According to an aspect, there is provided a fluid handling structure configured to supply and confine immersion liquid to a space defined between a projection system and a facing surface facing the fluid handling structure, the fluid handling structure comprising: a passage formed in the fluid handling structure; and a cavity completely enclosing at least a portion of the passage for the flow of a conditioning fluid therethrough.

According to an aspect, there is provided a device manufacturing method comprising: providing a fluid through a supply passage formed in a fluid handling structure to a space between a final element of a projection system and a substrate, wherein a thermal isolator at least partly around the supply passage isolates fluid in the supply passage from a thermal load induced in the fluid handling structure.

According to an aspect, there is provided a device manufacturing method comprising: providing a temperature conditioned fluid through a supply passage to a space between a final element of a projection system and a substrate or to an opening formed in an undersurface of the fluid handling structure; and providing temperature conditioned fluid which has not left the fluid handling structure and was provided through the supply passage to a further passage formed in the fluid handling structure.

According to an aspect, there is provided a device manufacturing method comprising: using a fluid handling structure to provide a fluid to a space between a final element of a projection system and a substrate; and removing fluid from the space through a removal passage in the fluid handling structure to outside of the fluid handling structure, wherein the path of the removal passage meanders through the fluid handling structure so as to thermally condition the fluid handling structure.

According to an aspect, there is provided a device manufacturing method comprising: using a fluid handling structure to provide fluid to a space between a final element of a projection system and a substrate; and providing a flow of conditioning fluid through a cavity which completely encloses at least a portion of a passage.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
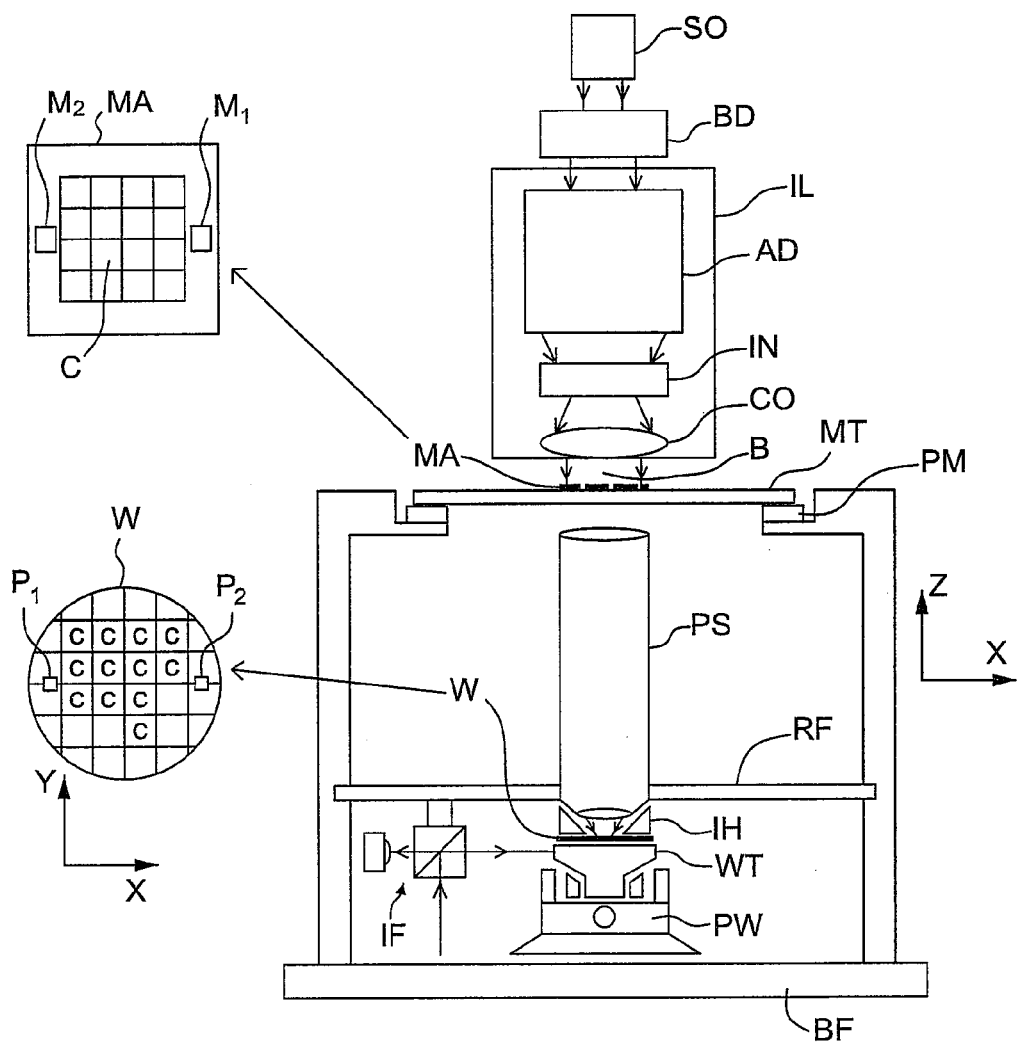
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-5 show different supply devices which can be used in such a system. Sealing features are present to seal liquid to the localized area. One way which has been proposed to arrange for this is disclosed in PCT patent application publication no. WO 99/49504.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and facing surface facing the projection system (such a facing surface may be the surface of a substrate and/or a substrate table). Any of the liquid supply devices of FIGS. 2-5 can be used in such a system. However, a sealing feature is not present, is not activated, is not as efficient as normal or is otherwise ineffective to seal liquid to only the localized area.

Figure 2:
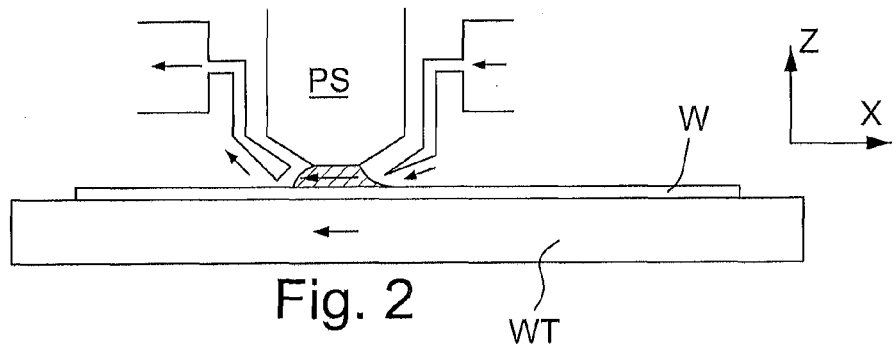
FIGS. 2 and 3 depict a liquid supply system for use in a lithographic projection apparatus.
Figure 3:
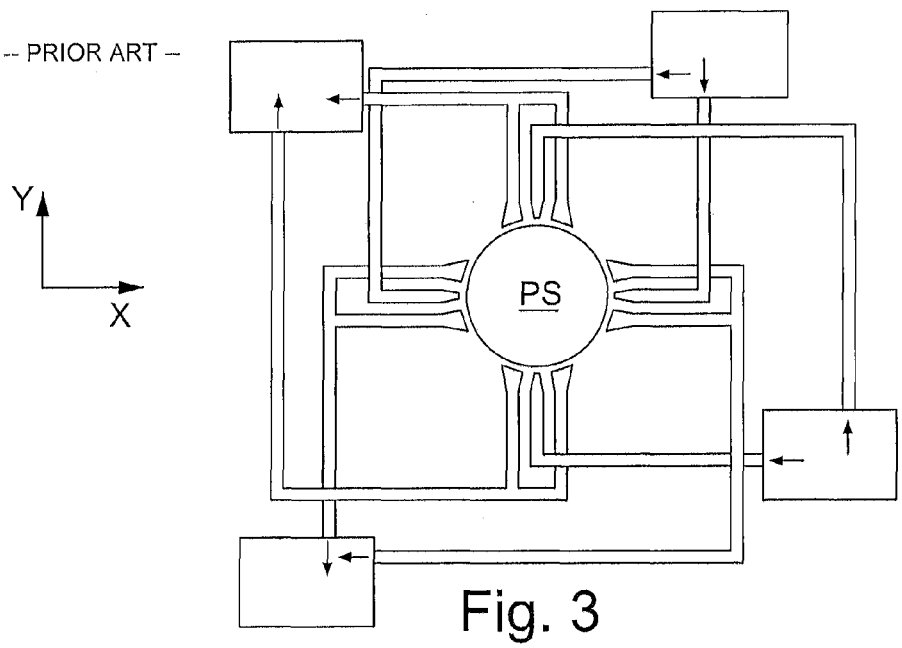

As illustrated in FIGS. 2 and 3, liquid is supplied by at least one inlet onto the substrate, preferably along the direction of movement of the substrate relative to the final element. Liquid is removed by at least one outlet after having passed under the projection system PS. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
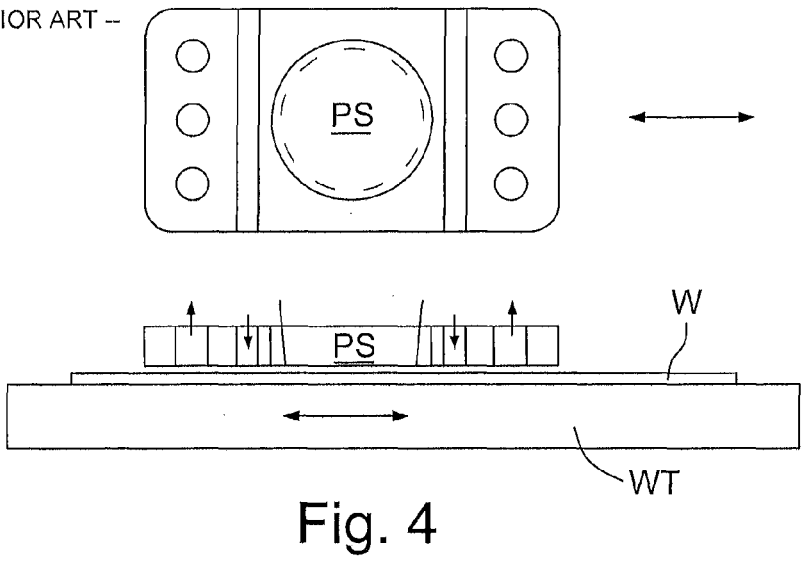
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Another arrangement which has been proposed is to provide the liquid supply system with liquid confinement structure which extends along at least a part of a boundary of the space between the final element of the projection system and the substrate table. Such an arrangement is illustrated in FIG. 5.

Figure 5:
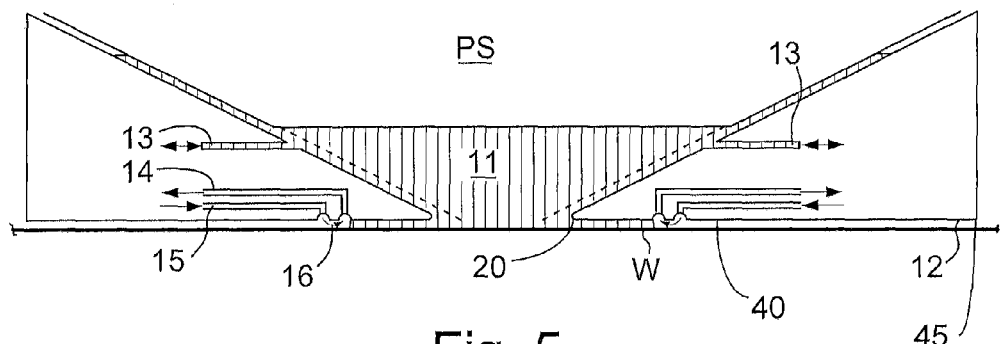
FIG. 5 depicts a further liquid supply system for use in a lithographic projection apparatus.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition or in the alternative to a surface of the substrate table WT, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as a gas seal (such as system with a gas seal is disclosed in European patent application publication no. EP 1420298) or liquid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery defined by an edge 20 of the undersurface 40 closely conforms to the shape of the image field, e.g., rectangular, though this need not be the case. The undersurface 40 has an outer edge 45 or rim.

The liquid may be contained in the space 11 by the gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

Figure 6:
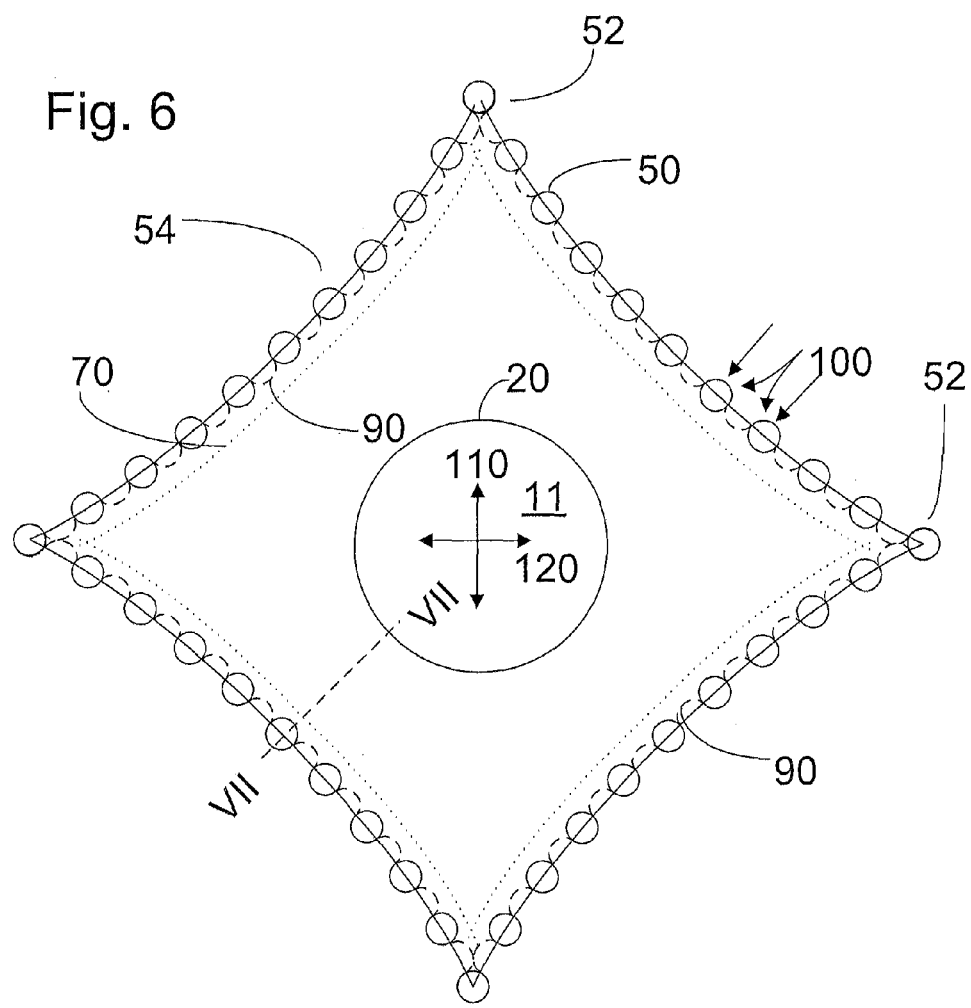
FIG. 6 depicts, in plan, a fluid handling structure according to an embodiment of the invention.

FIG. 6 illustrates, in plan, a meniscus pinning device of an embodiment of the present invention which may, for example, replace the seal arrangement 14, 15, 16 of FIG. 5. The meniscus pinning device of FIG. 6 comprises a plurality of discrete (extraction) openings 50. Each opening 50 has, in plan, a large maximum cross-sectional dimension, such as a diameter, perhaps with a maximum dimension of greater than 0.5 mm, desirably greater than 1 mm. Thus, the openings 50 are unlikely to be affected much by contamination.

Figure 7:
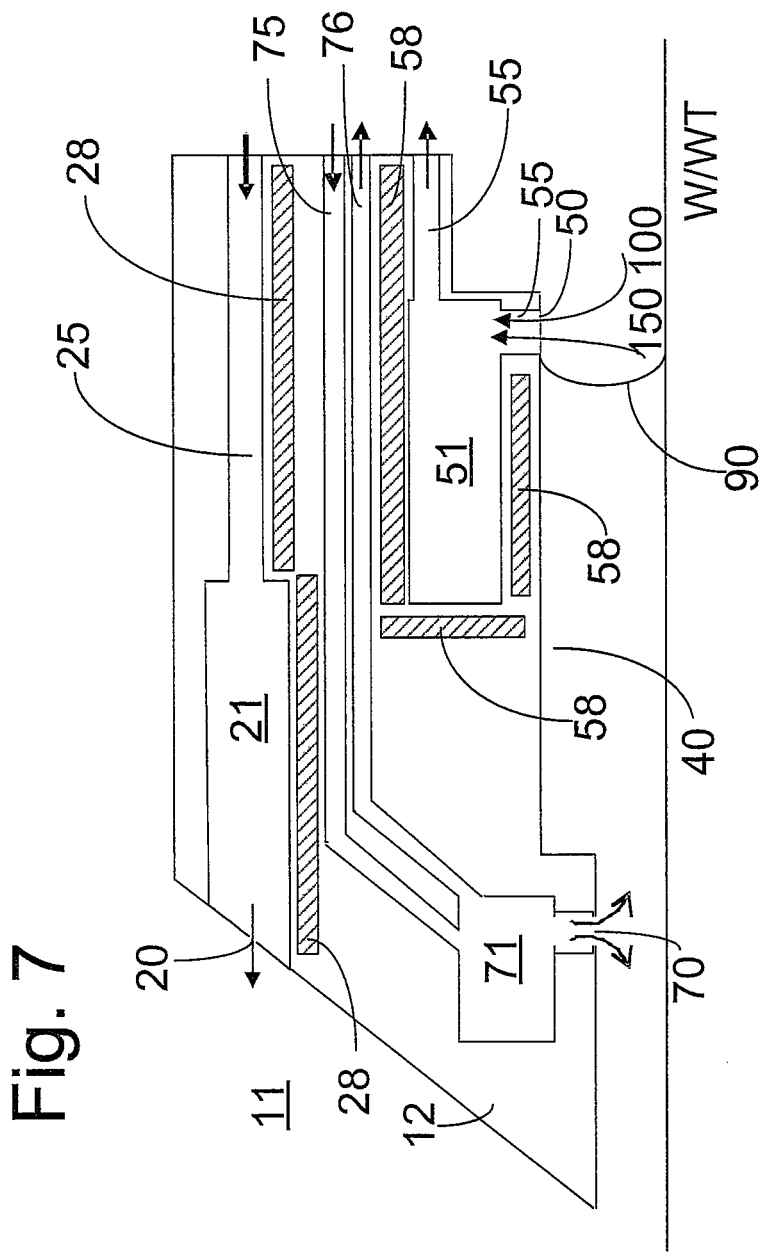
FIG. 7 depicts, in cross-section, through line VII-VII in FIG. 6, the fluid handling structure according to FIG. 6.

Each of the openings 50 of the meniscus pinning device of FIG. 6 may be connected to a separate under pressure source. Alternatively or additionally, each or a plurality of the openings 50 may be connected to a common chamber 51 (which may be annular) which is itself held at an under pressure, as illustrated in FIG. 7. In this way a uniform under pressure at each or a plurality of the openings 50 may be achieved.

Each opening 50 is designed to extract a mixture of liquid and gas, for example in a two phase flow. The liquid is extracted from the space 11 whereas the gas is extracted from the atmosphere on the other side of the opening 50 to the liquid. This creates a gas flow as illustrated by arrows 100. This gas flow induces drag forces and is effective to pin the meniscus 90 between the openings 50 substantially in place as illustrated in FIG. 6, for example between neighboring openings 50. The gas flow helps maintain the liquid confined by momentum blocking, by a gas flow induced pressure gradient and/or by drag (shear) of the gas flow on the liquid.

As can be seen from FIG. 6, the openings 50 are positioned so as to form, in plan, a polygonal shape. In the case of FIG. 6 this is in the shape of a rhombus with the principal axes 110, 120 aligned with the major directions of travel of the substrate W under the projection system PS. This helps ensure that the maximum scan speed is faster than if the openings 50 were arranged in a circular shape. Thus, throughput can be optimized by having the primary axis 110 of the shape of the openings 50 aligned with the major direction of travel of the substrate (usually the scan direction) and to have a second axis 120 aligned with the other major direction of travel of the substrate (usually the step direction). It will be appreciated that any arrangement in which θ is different to 90° will give an advantage. Thus, exact alignment of the principal axes with the major directions of travel is not vital. However, an embodiment of the present invention is applicable to any shape made by the openings 50 in plan, for example a circle.

Radially outward of the openings may be a gas knife opening through which a gas flow may be supplied during operation. Such as arrangement is described in U.S. patent application No. 61/181,158, filed 25 May 2009, which is hereby incorporated by reference in its entirety.

FIG. 7 is a cross-section through the fluid handling structure 12 along the line VII-VII shown in FIG. 6. In FIG. 7 an arrow 100 shows the flow of gas from outside of the fluid handling structure 12 into an extraction passage 55 associated with the opening 50. The chamber 51 is part of the extraction passage 55. The arrow 150 illustrates the passage of liquid from under the liquid confinement structure 12, which may have come from the space 11, into the opening 50. The extraction passage 55 and opening 50 are designed so that two phase extraction (i.e. gas and liquid) desirably occurs in an annular flow mode. In annular flow mode gas substantially flows through the center of the extraction passage 55 and liquid substantially flows along the walls of the extraction passage 55. This results in smooth flow with low generation of pulsations, thereby minimizing the vibrations which may otherwise occur.

The meniscus 90 is pinned between the openings 50 with drag forces induced by gas flow 100 into the openings 50 as described above in relation to FIG. 6. A gas drag velocity of greater than about 15 m/s, desirably 20 m/s is sufficient. In the illustrated embodiment there is no gas knife. By avoiding the use of a gas knife, the amount of evaporation of liquid from the substrate W may be reduced thereby reducing both splashing of liquid as well as thermal expansion/contraction effects.

A plurality of discrete openings 50 (e.g. around 300, such as 288), which may be in the form of needles or squares, each with a cross-sectional dimension selected from the range of 0.2 mm to 1 mm may be effective to pin a meniscus. The total gas flow in such a system is of the order of 100 l/min.

Further details of the openings 50 and the fluid handling structure 12 can be found in U.S. patent application publication no. US 2008/0212046 which is hereby incorporated by reference in its entirety.

Formed in the undersurface 40 of the liquid confinement structure 12 is a gap supply opening 70 which is configured to outlet fluid (e.g. liquid, such as immersion liquid) from the liquid confinement structure 12 into the gap between the liquid confinement structure 12 and the substrate W or substrate table WT. The gap supply opening 70 is radially inwardly, with respect to the optical axis of the projection system PS, of the extraction opening 50. The liquid exiting the gap supply opening 70 of the liquid confinement structure 12 is directed towards the substrate W. This type of gap supply opening 70 may be provided to reduce the chances of bubbles being generated in the immersion liquid. Gas may become trapped in a gap between the edge of the substrate W and the substrate table WT. At an advancing part of the undersurface 40 of the liquid confinement structure 12, the facing surface of the substrate W may be moving sufficiently fast relative to, the liquid confinement structure 12 such that liquid is unable to flow from the space 11 to the opening 50. A portion of the undersurface 40 of the liquid confinement structure 12 between the edge 20 and the opening 50 may become de-wetted, affecting the effectiveness of the meniscus pinning of the opening 50. Supplying liquid through the gap supply opening 70, desirably near the opening 50, thereby may reduce the risk of bubble inclusion and de-wetting.

The geometry of the gap supply opening 70 has an impact upon the effectiveness of the fluid handling structure 12 in containing liquid.

In particular, it is desirable that the gap supply opening 70 has a shape, in plan which is cornered, like the shape of the opening 50, in plan. Indeed, the cornered shapes of the gap supply opening 70 and opening 50 are desirably substantially similar. In an embodiment, each shape has, at the apex of each corner an opening 70 or opening 50. Desirably each opening 70 is within 10 mm, desirably 5 mm of an opening 50. That is, all parts of the shape made by the opening 50 is within 10 mm of a part of the shape made by the gap supply opening 70.

Further details regarding the extraction openings 50 and gap supply openings 70 may be found in U.S. patent application publication no. US 2009-0279060, which is hereby incorporated by reference in its entirety.

One or more supply openings 22 in a surface of the liquid confinement structure 12 which defines the space 11 provide liquid to the space 11. Liquid is provided to the supply opening 22 through a supply passage 25 to the space 11. A supply chamber 21 may be provided. One wall defining the supply chamber 21 may have the opening 20 formed in it. One or more supply passages 25 may provide immersion liquid to the supply chamber 21. The supply chamber 21 may be regarded as part of the supply passage 25. On the opposite side of the immersion space 11 to the opening 20 there is one or more removal openings formed in the liquid confinement structure 12. Liquid is removed from the space 11 through the removal opening via one or more removal passages. A removal chamber similar to the supply chamber 21 may or may not be provided.

Liquid is provided to the gap opening 70 via gap supply passage 75. A gap supply chamber 71 may be provided in the similar way to chambers 21 and 51. The gap supply chamber 71 forms part of the gap supply passage 75 which provides immersion liquid to the gap supply opening 70.

The gas flow 100 and liquid flow 150 into the extraction passage 55 can result in a large cooling load. This is because of the large flow of gas 100 can lead to evaporation of liquid in the liquid flow 150. This large evaporational cooling load can conduct through the material of the liquid confinement structure 12 thereby affecting the temperature of fluid in the supply passage 25 and gap supply passage 75. Particularly in the case of the supply passage 25 which supplies liquid to the space 11, this can lead to a non uniform temperature distribution in the liquid in the space 11 and thereby may cause an imaging defect. Furthermore, the supply passage 25 is close to the top of the liquid confinement structure 12 and thereby close to the final element of the projection system PS. A non uniform temperature distribution at the top of the liquid confinement structure 12 can lead to an aberration in the final element of the projection system PS and is therefore undesirable.

The cooling effect experienced by two phase flow in the extraction channel 55 may be mitigated in one of several ways. In one embodiment it is possible to add liquid to the extraction passage 55 so that there is always sufficient liquid flow thereby reducing evaporational cooling. In one embodiment the inner surface defining the extraction passageway 55 may be made of a material or coated with a coating which is lyophobic to the immersion liquid. This reduces cooling. In an embodiment the gas provided in the gas flow 100 can be saturated in vapor of the immersion liquid. This also reduces the cooling load.

FIG. 7 illustrates several thermal isolators which at least partly isolate fluid in the supply passage 25 from a thermal load induced in the liquid confinement structure 12. In particular, the thermal isolators isolate fluid in the supply passage 25 from a thermal load induced by evaporation of fluid in the extraction passage 55.

Two of the thermal isolators 28, 76 are positioned adjacent the supply passage 25. One thermal isolator 58 is positioned adjacent the extraction passage 55.

The first thermal isolator illustrated in FIG. 7 is an insulator 28. The insulator 28 is positioned adjacent the supply passage 25 at least partly to isolate fluid in the supply passage 25 from a thermal load induced in the liquid confinement structure 12. The thermal insulator 28 may be a gas in a cavity or a vacuum in a cavity or a material with a lower coefficient of thermal conductivity than the material of the liquid confinement structure 12. In one embodiment the thermal insulator may be a cavity at least partly surrounding the supply passage 25. The cavity may be the same as the cavity described with reference to FIG. 12 below.

The third thermal isolator of FIG. 7 is similar to the first thermal isolator. That is, a thermal insulator 58 may be provided adjacent the extraction passage 55. Apart from its position the thermal insulator 58 may be the same as the thermal insulator 28 described above.

The second thermal isolator comprises a further passage 76 formed in the liquid confinement structure 12. The further passage 76 is for the flow of temperature conditioned fluid therein. Temperature conditioned fluid is provided through gap supply passage 75 to gap supply chamber 71. This is for provision of liquid to the gap supply opening 70 so that the liquid can be provided to the gap between the liquid confinement structure 12 and the substrate W or substrate table WT (i.e. the surface forming the facing surface). In an embodiment a further passage 76 is provided in fluid communication with the gap supply chamber 71. Any excess fluid provided through gap supply passage 75 to gap supply chamber 71 can be removed through further passage 76. Further passage 76 can be formed in the liquid confinement structure 12 so that it is positioned where a heat load is present. Thereby excess heat can be taken from that location or provided to that location, as required. Therefore, the further passage 76 is for removal of temperature conditioned fluid which has not left the liquid confinement structure 12 after having been provided to the liquid confinement structure 12 (through gap supply passage 75) in the conditioned state. Put another way, the further passage 76 is for removal of excess fluid provided towards the gap supply opening 70 formed in the liquid confinement structure 12.

Figure 8:
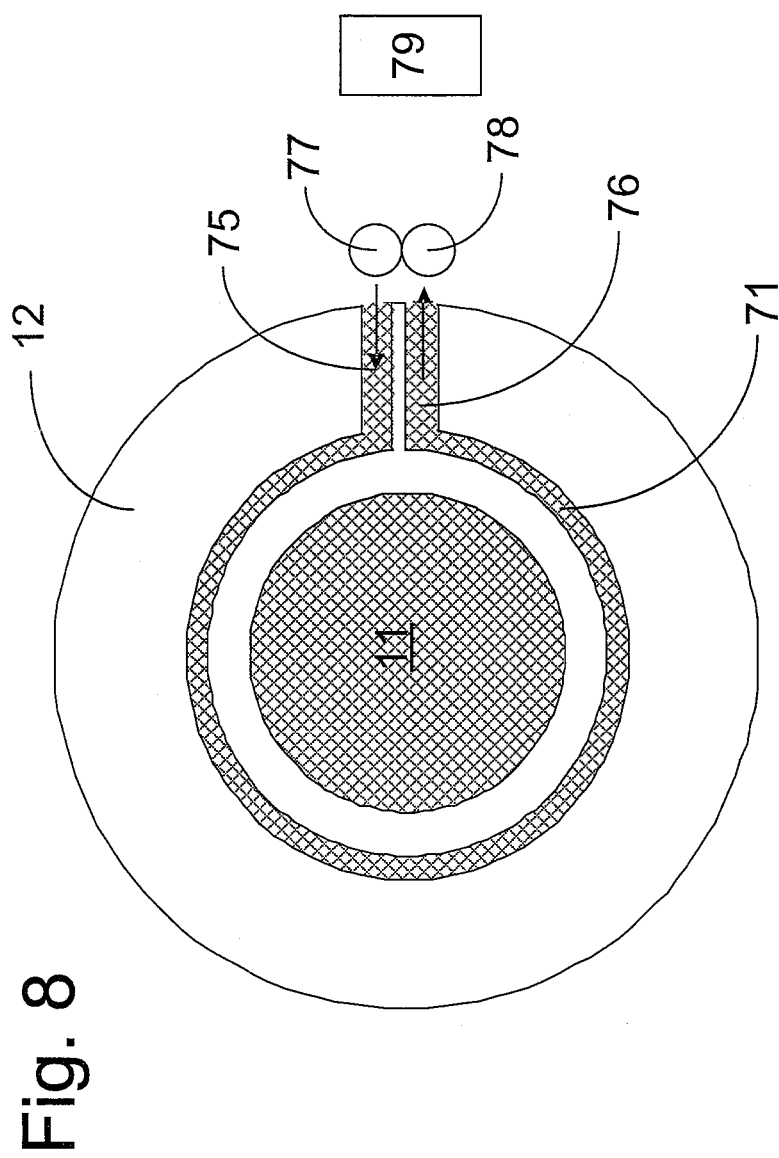
FIG. 8 depicts, from above, supply passages formed in the fluid handling structure of FIG. 7.

FIG. 8 is a view from above the liquid confinement structure 12 illustrating the gap supply passage 75, gap supply chamber 71 and further passage 76. As can be seen, the gap supply chamber 71 is not made as a complete annulus. This helps ensure that there is a flow of fluid around the chamber 71 between it being supplied to the chamber by gap supply passage 75 and being removed from the chamber by further passage 76. In FIG. 8 the further passage 76 is shown as exiting directly to the edge of the liquid confinement structure 12. However, this may not be the case and the further passage 76 may take a tortuous path out to the edge of the liquid confinement structure 12 (e.g. it may meander). In this way the further passage 76 can pass close to areas of high heat load (such as extraction passage 55). The further passage 76 may change cross-sectional dimension (e.g., diameter) and have a constant or non constant rate of meander as discussed further in relation to FIG. 10 below.

Also illustrated in FIG. 8 is a simple feedback circuit which can be used to adjust the temperature of the conditioned fluid according to the heat load currently experienced by the conditioned fluid passing through the gap supply passage 75, the gap supply chamber 71 and the further passage 76. A temperature sensor 78 is provided at the outlet of the further passage 76. The temperature sensor 78 provides information about the temperature of the fluid exiting the further passage 76 to a controller 79. Based on this information the controller 79 controls a heater 77 configured to heat the fluid entering the gap supply passage 75 at an inlet accordingly. The heater 77 could also or alternatively function as a cooler, if necessary.

The removal passage mentioned above but not illustrated in FIG. 7 for extracting liquid from the space 11 could function in a similar way to the further passage 76. This is because liquid entering the removal passage is temperature conditioned fluid which has exited supply opening 20 into space 11. While in space 11 the liquid may be heated slightly by the patterned beam passing through it. Therefore by forming the removal passage in the liquid confinement structure 12 so that it goes close to a source of heat extraction (e.g. extraction passage 55) this can help in reducing the effect of that heat extraction. The removal passage may have a non constant cross-sectional dimension (e.g., diameter) and/or constant or non constant meander rate as described in relation to FIG. 10 below.

The removal passage is therefore of a length greater than required simply for the removal of liquid from the space 11 to outside of the liquid confinement structure 12.

In an embodiment an additional passage for the flow of temperature conditioned fluid through it is provided in the liquid confinement structure 12. The additional passage serves no other purpose other than thermally to condition the liquid confinement structure 12. The measures applied to the further passage 76 described above can also be applied to this additional passage.

Figure 9:
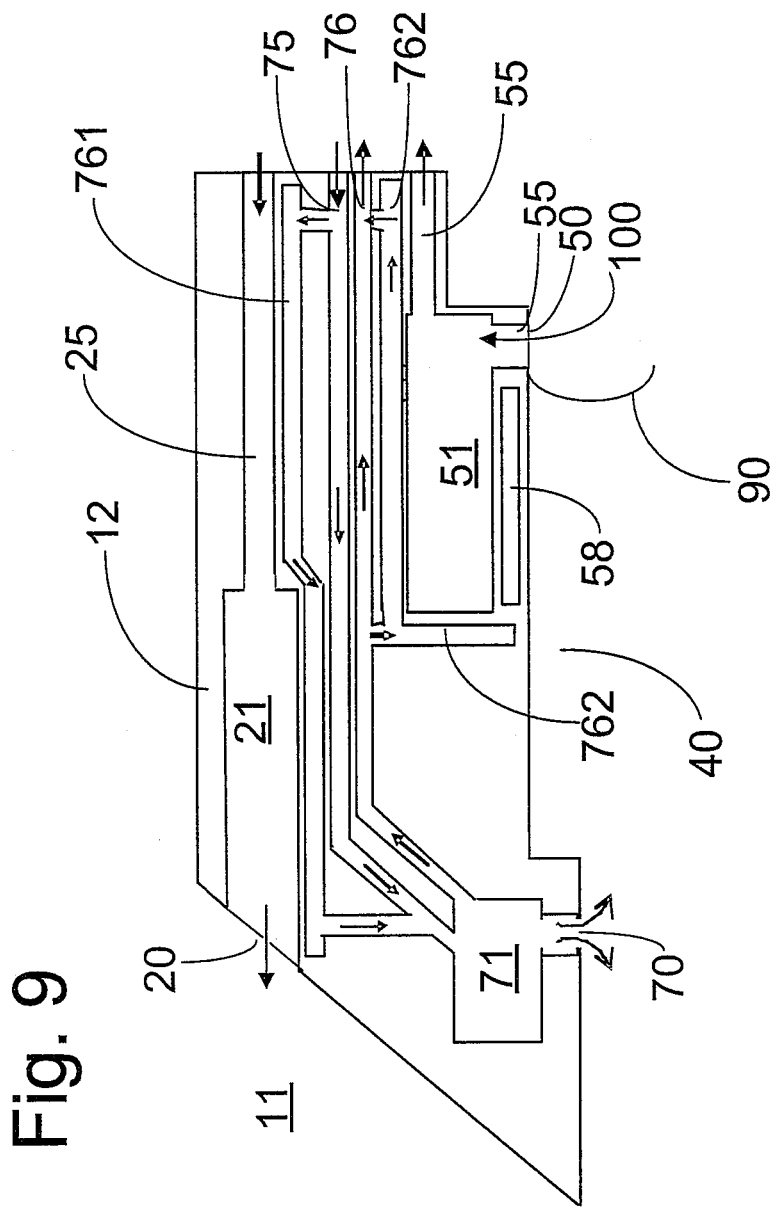
FIG. 9 depicts, in cross-section, a fluid handling structure according to an embodiment of the invention.

FIG. 9 illustrates an embodiment which is the same as the embodiment of FIG. 7 except as described below. In the FIG. 9 embodiment only one of the thermal insulators 28, 58 of the FIG. 7 embodiment is depicted (under chamber 51). Instead or additionally, additional further passages 761, 762 are provided. These additional further passages 761, 762 have temperature conditioned fluid flowing through them provided either from the gap supply passage 75, the gap supply chamber 71 or the further passage 76. The additional further passage 761 is formed in the liquid confinement structure 12 adjacent the supply passage 25. That additional further passage 761 receives its conditioned fluid from the gap supply passage 75. Fluid exiting the additional further passage 761 is returned to the gap supply passage 75. Alternatively the fluid may be returned or may be provided to the gap supply chamber 71 or to the further passage 76 or may be provided to an opening in the liquid confinement structure 12 for removal.

The additional further passage 762 is provided adjacent the extraction passage 55. The additional further passage 762 receives fluid from the further passage 76 and returns it to the further passage 76. However, the additional further passage 762 could receive fluid directly from the gap supply chamber 71 or the gap supply passage 75. Additionally or alternatively, the additional further passage 762 may provide its fluid directly to an outlet of the liquid confinement structure 12.

Although two additional further passages 761, 762 are illustrated in FIG. 9, this is not necessarily the case and only one or more than two additional passages could be provided. The additional further passages 761, 762 can have all of the features of the further passage 76 mentioned above.

The multiple further passages 76, 761, 762 can be provided as completely separate passages as illustrated in FIG. 9 or may be provided directly next to one another in the form of one channel which has been sub-divided into a plurality of channels. An advantage of sub-dividing one channel into a plurality of channels is that this reduces the volume needed to define the channels.

Figure 10:
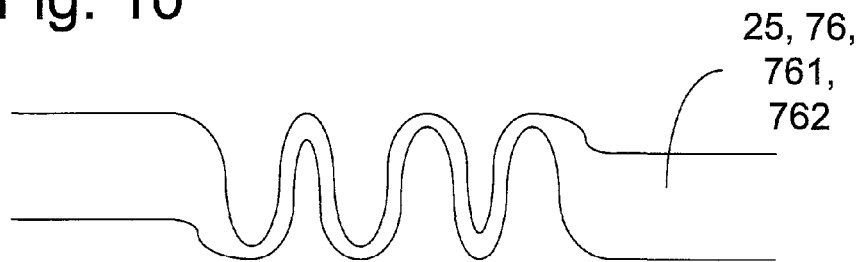
FIG. 10 illustrates schematically how the diameter and meander rate of a passage may change along its length.

FIG. 10 illustrates how the further passage 76, 761, 762 or the removal passage or any other similar passage can be formed locally to increase the heat transfer quotient. As is illustrated in FIG. 10 the cross-sectional dimension (e.g., diameter) of the passage may vary. The passage may also follow a meander path as illustrated in the middle of the passage of FIG. 10. The rate of meander (i.e. frequency of turns per length) can be varied. With a higher rate of meander the surface area and thereby heat transfer coefficient is increased thereby providing better local heating or cooling. In areas where cold spots form and heat is transferred to the liquid confinement structure 12 a thin passage with a high meander rate can be used.

Figure 11:
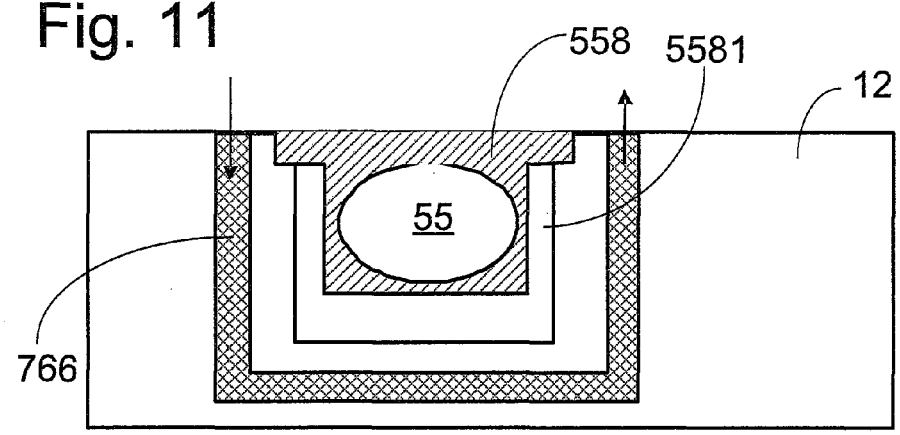
FIG. 11 illustrates, in cross-section through the elongate direction of a passage, an extraction passage and the surrounding area of the fluid handling structure.

FIG. 11 shows an extraction passage 55 and surrounding liquid confinement structure 12 in cross-section through the extraction passage 55. Several of the above mentioned measures have been taken in order thermally to isolate the remainder of the liquid confinement structure 12 from a cooling effect which can take place in the extraction passage 55.

The extraction passage 55 is formed such that it has a constant cross-sectional area and/or shape along its length. Any corners are radiused so that there are smooth transitions in changes of direction of the extraction passage 55. Changes in cross-section can cause changes in the flow velocity which may enhance turbulent flow and subsequently pressure fluctuation. Such a pressure fluctuation in turn may cause a pressure fluctuation in the chamber 51. Pressure fluctuation in chamber 51 may cause variations in flow 100 which in turn may cause pressure fluctuation between the liquid confinement structure 12 and the substrate W. Pressure fluctuation between the liquid confinement structure 12 and the substrate W may cause force variation on the substrate table WT which in turn can lead to a position error. Another reason to avoid abrupt cross-sectional dimension changes of extraction ducts in two phase flows in particular is that it may result in dead zones in which a build up of liquid can occur which in turn may temporarily block the gas passage. Liquid that fills the entire cross-section is referred to as a slug in literature. Once that slug is formed it is violently accelerated into the extraction system due to the build up of a pressure difference over the slug which corresponds to a pressure fluctuation in the extraction system which can have a negative effect on the substrate W position as explained above. The extraction passage 55 is defined by a material 558. The material 558 may serve at least two functions. First the material 558 may be a thermal insulator with a coefficient of thermal conduction lower than that of the material of the liquid confinement structure 12. Second, the material of the insulator 558 may be chosen such that it is lyophobic to the immersion liquid. The material of the insulator 558 may be a plastic, built up, for example, layer by layer. A low thermal conductivity plastic is desirable. Suitable examples include Teflon (PTFE), Kapton ($C_{22}H_{10}N_2O_5$), and/or POM (polyoxymethylene resin).

At least partly surrounding the passage 55 is a void 5581. The void 5581 may be filled with gas (for example air) or it may be under vacuum.

A further passage 766 is also illustrated with arrows indicating the flow of fluid through the further passage 766. The further passage 766 may be formed in a spiral like shape around at least a part of the length of the extraction passage 55. The further passage 766 may be equivalent to the further passage 76 or additional further passages 761, 762 of FIG. 7 or 9. Alternatively the further passage 766 could be an additional passage provided only for the thermal conditioning of the liquid confinement structure 12 or could be a further passage which branches off the removal passage 25.

Figure 12:
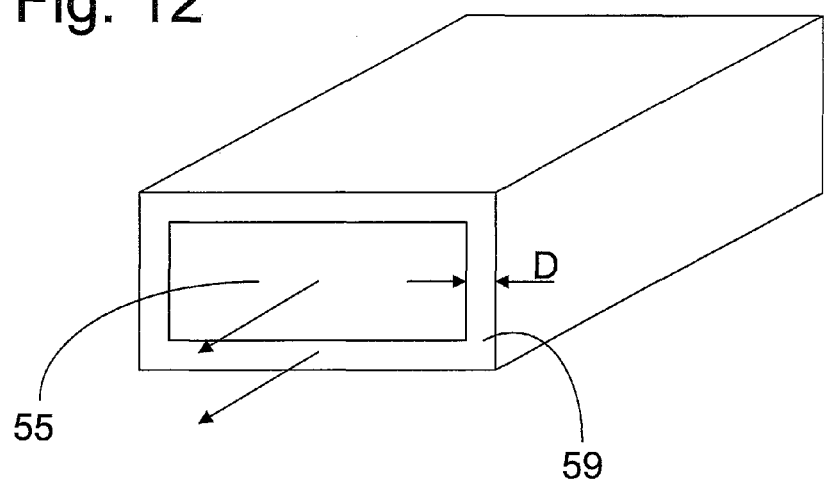
FIG. 12 illustrates schematically a further embodiment of an extraction passage.

FIG. 12 illustrates an embodiment of the invention. In FIG. 12 a cavity 59 is provided around the extraction channel 55. The cavity 59 at least partly surrounds the extraction channel 55. The cavity 59 in one embodiment is annular around the extraction passage 55. The cavity 59 completely encloses at least a portion of the extraction passage 55. The cavity 59 is arranged to have a flow of fluid therethrough. As illustrated by arrows, in one embodiment the conditioning fluid flowing through the cavity 59 is in the same direction as the fluid flow through extraction passage 55. However, this may not be the case and the flow of conditioning fluid in the cavity 59 may be in a direction opposite to that of the flow of fluid in the extraction passage 55.

The conditioning fluid used in the cavity 59 is desirably liquid, in one embodiment the fluid may be the same as that of the immersion liquid. In another embodiment the conditioning fluid may be different to the immersion fluid.

Although the cavity 59 is illustrated in FIG. 12 as surrounding the extraction passage 55, this is not necessarily the case and the cavity 59 could surround other passages, such as the supply passage 25 or removal passage associated with space 11 or the gap supply passage 75.

A flow rate of about 0.2 liters per minute can reduce the magnitude of the cold load generated by the extraction passage 55 by 5 times for a specific device, but may be more or less for other devices. The annular thickness D of the cavity 59 is of the order of 300 μm. Desirably the thickness is selected from the range of 0.1 mm-1 mm, more desirably from the range of 0.2 mm-0.5 mm.

The maximum cross-sectional dimensions of the removal, further and additional passages could be as little as 0.2 mm. However, a greater dimensions is desirable for easy manufacture and higher flow rates. In a one embodiment the maximum cross-sectional dimension is selected from the range of 0.5 mm-1 mm. The cross-section can vary and is not necessary for the cross-section to be constant throughout the length of the passage 59.

The additional flow rate of fluid of any of the above embodiments is less than 500 ml per minute. For example, if there are four extraction passages 55, using the thermal isolator of FIG. 12 in the form of a cavity may require about 200 ml per minute divided over the four channels. For the embodiments of FIGS. 7 and 9 the increased flow rate into one or more gap supply channels 75 would be of the order of 100 ml per minute or less. All of those values are on the basis of the conditioning fluid being ultra pure water.

The examples of FIGS. 5 and 6 are a so called localized area arrangement in which liquid is only provided to a localized area of the top surface of the substrate W at any one time. Other arrangements are possible such as an arrangement using a single phase extractor on the undersurface 40 of the liquid confinement structure 12. The single phase extractor may actually work in two phases and thereby suffer from the same problem as the passage 55 described above. An extractor assembly comprising a single phase extractor with a porous member is described in U.S. patent application publication no. US 2006/0038968, incorporated herein in its entirety by reference. An arrangement in which such an extractor assembly is used in combination with a recess and a gas knife is disclosed in detail in U.S. patent application publication no. US 2006/0158627 incorporated herein in its entirety by reference. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application publication no. US 2010-0060868.

In an aspect, there is provided a fluid handling structure configured to supply and confine immersion liquid to a space defined between a projection system and a facing surface facing the fluid handling structure, the fluid handling structure comprising: a supply passage formed therein for the passage of fluid from outside the fluid handling structure to the space; and a thermal isolator positioned adjacent the supply passage at least partly to isolate fluid in the supply passage from thermal loads induced in the fluid handling structure. Desirably the thermal isolator is positioned between the supply passage and an extraction passage which is for the passage of fluid from a gap between the fluid handling structure and the facing surface to outside of the fluid handling structure. Desirably the thermal isolator comprises a thermal insulator. Desirably the thermal insulator is gas or a vacuum or a material with a lower coefficient of thermal conductivity than the material of the fluid handling structure. Desirably the thermal isolator is a cavity surrounding the supply passage. Desirably the cavity is arranged for the flow of a conditioning fluid therethrough. Desirably the cavity has a thickness in a direction perpendicular to a direction in which the supply passage is elongate selected from the range of 0.1 mm to 1 mm, desirably from the range of 0.2 mm to 0.5 mm. Desirably the thermal isolator comprises a further passage formed in the fluid handling structure for the flow of temperature conditioned fluid therein. Desirably the further passage is for removal of temperature conditioned fluid which has not left the fluid handling structure after being provided to the fluid handling structure in the conditioned state. Desirably the further passage is for removal of excess fluid provided towards an opening formed in the fluid handling structure. Desirably the opening is formed in a surface of the fluid handling structure defining the space or in an under surface of the fluid handling structure. Desirably the further passage comprises an inlet at one end and an outlet at the other end, and the structure further comprises a sensor configured to measure the temperature of fluid adjacent the outlet, a heater configured to increase the temperature of fluid adjacent the inlet and a controller configured to adjust the temperature of fluid adjacent the inlet using the heater on the basis of a signal from the sensor.

In an aspect, there is provided a fluid handling structure configured to supply and confine immersion liquid to a space defined between a projection system and a facing surface facing the fluid handling structure, the fluid handling structure comprising: a supply passage formed therein for the passage of temperature conditioned fluid from outside the fluid handling structure to an opening formed in a surface of the fluid handling structure defining the space or to an opening formed in an under surface of the fluid handling structure; and a further passage formed in the fluid handling structure for the passage therein of temperature conditioned fluid which has not left the fluid handling structure and provided through the supply passage. Desirably the further passage is for removal of the temperature conditioned fluid. Desirably the further passage acts as a thermal isolator to isolate a portion of the fluid handling structure from a temperature fluctuation, particularly a temperature fluctuation caused by two phase flow in an extraction passage formed in the fluid handling structure. Desirably the further passage has a non constant cross-sectional dimension and/or meanders with a constant or non constant meander rate along its length so as to apply a varying heat load to the fluid handling structure along its length.

In an aspect, there is provided a fluid handling structure configured to supply and confine immersion liquid to a space defined between a projection system and a facing surface facing the fluid handling structure, the fluid handling structure comprising: a removal passage formed in the fluid handling structure for the passage of fluid from the space through the fluid handling structure to outside of the fluid handling structure, wherein the path of the removal passage meanders through the fluid handling structure so as to thermally condition the fluid handling structure. Desirably the removal passage has a non constant cross-sectional dimension and/or meanders with a constant or non constant meander rate along its length so as to apply a varying heat load to the fluid handling structure along its length.

In an aspect, there is provided a fluid handling structure configured to supply and confine immersion liquid to a space defined between a projection system and a facing surface facing the fluid handling structure, the fluid handling structure comprising: a passage formed in the fluid handling structure; and a cavity completely enclosing at least a portion of the passage for the flow of a conditioning fluid therethrough. Desirably the cavity has a thickness in a direction perpendicular to the direction of the passage selected from the range of 0.1 mm to 1 mm, desirably from the range of 0.2 mm to 0.5 mm. Desirably the passage is an extraction passage, desirably an extraction passage is for extracting two phases from an undersurface of the fluid handling structure.

In an aspect, there is provided an immersion lithographic apparatus comprising the above fluid handling structure.

In an aspect, there is provided a device manufacturing method comprising: providing a fluid through a supply passage formed in a fluid handling structure to a space between a final element of a projection system and a substrate, wherein a thermal isolator at least partly around the supply passage isolates fluid in the supply passage from a thermal load induced in the fluid handling structure.

In an aspect, there is provided a device manufacturing method comprising: providing a temperature conditioned fluid through a supply passage to a space between a final element of a projection system and a substrate or to an opening formed in an undersurface of the fluid handling structure; and providing temperature conditioned fluid which has not left the fluid handling structure and was provided through the supply passage to a further passage formed in the fluid handling structure.

In an aspect, there is provided a device manufacturing method comprising: using a fluid handling structure to provide a fluid to a space between a final element of a projection system and a substrate; and removing fluid from the space through a removal passage in the fluid handling structure to outside of the fluid handling structure, wherein the path of the removal passage meanders through the fluid handling structure so as to thermally condition the fluid handling structure.

In an aspect, there is provided a device manufacturing method comprising: using a fluid handling structure to provide fluid to a space between a final element of a projection system and a substrate; and providing a flow of conditioning fluid through a cavity which completely encloses at least a portion of a passage.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure configured to supply and confine immersion liquid to a space defined between a projection system and a facing surface facing the fluid handling structure, the fluid handling structure comprising:
a supply passage formed therein for the passage of fluid from outside the fluid handling structure to the space; and
a thermal isolator positioned adjacent the supply passage at least partly to isolate fluid in the supply passage from a thermal load induced in the fluid handling structure, the thermal isolator comprising a further passage, formed in the fluid handling structure, configured to remove fluid provided through the fluid handling structure towards an opening formed in a surface of the fluid handling structure defining the space or in an under surface of the fluid handling structure but before the fluid provided towards the opening exits the opening.

2. The fluid handling structure of claim 1, wherein the thermal isolator is positioned between the supply passage and an extraction passage which is for the passage of fluid from a gap between the fluid handling structure and the facing surface to outside of the fluid handling structure.

3. The fluid handling structure of claim 1, wherein the thermal isolator comprises a thermal insulator.

4. The fluid handling structure of claim 3, wherein the thermal insulator is gas or a vacuum or a material with a lower coefficient of thermal conductivity than the material of the fluid handling structure.

5. The fluid handling structure of claim 1, wherein the thermal isolator comprises a cavity surrounding the supply passage.

6. The fluid handling structure of claim 5, wherein the cavity is arranged for the flow of a conditioning fluid therethrough.

7. The fluid handling structure of claim 5, wherein the cavity has a thickness in a direction perpendicular to a direction in which the supply passage is elongate selected from the range of 0.1 mm to 1 mm.

8. The fluid handling structure of claim 1, wherein the further passage comprises an inlet at one end and an outlet at the other end, and further comprising a sensor configured to measure the temperature of fluid adjacent the outlet, a heater configured to increase the temperature of fluid adjacent the inlet and a controller configured to adjust the temperature of fluid adjacent the inlet using the heater on the basis of a signal from the sensor.

9. The fluid handling structure of claim 1, wherein the further passage has a non constant cross-sectional dimension and/or meanders with a constant or non constant meander rate along its length so as to apply a varying heat load to the fluid handling structure along its length.

10. A device manufacturing method comprising:
providing a fluid through a supply passage formed in a fluid handling structure to a space between a final element of a projection system and a substrate, wherein a thermal isolator at least partly around the supply passage isolates fluid in the supply passage from a thermal load induced in the fluid handling structure, the thermal isolator comprising a further passage formed in the fluid handling structure; and
removing, through the further passage, fluid provided through the fluid handling structure towards an opening formed in a surface of the fluid handling structure defining the space or in an under surface of the fluid handling structure but before the fluid provided towards the opening exits the opening.

11. The method of claim 10, further comprising removing fluid from a gap between the fluid handling structure and the facing surface to outside of the fluid handling structure using an extraction passage, the thermal isolator positioned between the supply passage and the extraction passage.

12. The method of claim 10, wherein the thermal isolator comprises a thermal insulator.

13. The method of claim 10, wherein the further passage comprises an inlet at one end and an outlet at the other end, and further measuring the temperature of fluid adjacent the outlet using a sensor and adjusting the temperature of fluid adjacent the inlet using a heater on the basis of a signal from the sensor.

14. The method of claim 10, wherein the further passage has a non constant cross-sectional dimension and/or meanders with a constant or non constant meander rate along its length so as to apply a varying heat load to the fluid handling structure along its length.

15. The method of claim 10, wherein the fluid provided towards the opening comprises immersion liquid.

16. The apparatus of claim 1, wherein the fluid provided towards the opening comprises immersion liquid.

17. A lithographic apparatus comprising:
a projection system configured to project a beam of radiation onto a substrate;

a movable table configured to support the substrate;

a fluid handling structure configured to supply and confine immersion liquid to a space defined between a projection system and a facing surface facing the fluid handling structure, the fluid handling structure comprising:

a supply passage formed therein for the passage of fluid from outside the fluid handling structure to the space; and a thermal isolator positioned adjacent the supply passage at least partly to isolate fluid in the supply passage from a thermal load induced in the fluid handling structure, the thermal isolator comprising a further passage, formed in the fluid handling structure, configured to remove fluid provided through the fluid handling structure towards an opening formed in a surface of the fluid handling structure defining the space or in an under surface of the fluid handling structure but before the fluid provided towards the opening exits the opening.

18. A lithographic apparatus comprising:

a projection system configured to project a beam of radiation onto a substrate;

a movable table configured to support the substrate;

a fluid handling structure configured to supply and confine immersion liquid to a space defined between a projection system and a facing surface facing the fluid handling structure, the fluid handling structure comprising:

a supply passage configured to pass immersion liquid to the space; and a thermal isolator, positioned adjacent the supply passage, configured to at least partly isolate immersion liquid in the supply passage from a thermal load induced in the fluid handling structure, the thermal isolator configured to receive at least some of the immersion liquid provided to the fluid handling structure for supply to the space, expose the at least some of the immersion liquid to the thermal load and cause the at least some of the immersion liquid to flow out of the fluid handling structure without going into the space.

19. A device manufacturing method comprising:

providing a fluid through a supply passage formed in a fluid handling structure to a space between a final element of a projection system and a substrate, wherein a thermal isolator at least partly isolates fluid in the supply passage from a thermal load induced in the fluid handling structure;

flowing a fluid through a passage of the fluid handling structure towards an opening fluidly connected to the space;

receiving at least part of the fluid in the thermal isolator;

exposing the at least part of the fluid to the thermal load; and causing the at least part of the fluid to flow out of the fluid handling structure without going into the space.

20. The method of claim 19, wherein the at least part of the fluid comes from the passage.

21. A lithographic apparatus comprising:

a projection system configured to project a beam of radiation onto a substrate;

a movable table configured to support the substrate;

a fluid handling structure configured to supply and confine immersion liquid to a space defined between a projection system and a facing surface facing the fluid handling structure, the fluid handling structure comprising:

a supply passage configured to supply a fluid to the space; and a thermal isolator, positioned adjacent the supply passage, configured to at least partly isolate fluid in the supply passage from a thermal load induced in the fluid handling structure, the thermal isolator configured to receive at least some of the fluid from the supply passage, expose the at least some of the fluid to the thermal load and cause the at least some of the fluid to flow out of the fluid handling structure without going into the space.

22. The apparatus of claim 21, wherein the fluid provided towards the opening comprises immersion liquid.

23. A fluid handling structure configured to supply and confine immersion liquid to a space defined between a projection system and a facing surface facing the fluid handling structure, the fluid handling structure comprising:

a supply passage configured to pass a fluid to the space; and a thermal isolator positioned adjacent the supply passage at least partly to isolate fluid in the supply passage from a thermal load induced in the fluid handling structure, the thermal isolator comprising a further passage, formed in the fluid handling structure, configured to remove fluid provided towards an opening of the supply passage formed in a surface of the fluid handling structure, the further passage intersecting the supply passage prior to the opening.

24. The apparatus of claim 23, wherein the fluid provided towards the opening comprises immersion liquid.

* * * * *